United States Patent
Böttcher et al.

(10) Patent No.: US 6,919,721 B2
(45) Date of Patent: Jul. 19, 2005

(54) HYBRID CSI PROCEDURE

(75) Inventors: Uwe Böttcher, Uttenreuth (DE); Jan Ruff, München (DE); Stefan Röll, Seigendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/810,363

(22) Filed: Mar. 26, 2004

(65) Prior Publication Data

US 2004/0257077 A1 Dec. 23, 2004

(30) Foreign Application Priority Data

Mar. 28, 2003 (DE) .......................................... 103 14 407

(51) Int. Cl.[7] .................................................. G01V 3/00
(52) U.S. Cl. ....................................... 324/307; 324/309
(58) Field of Search .................................. 324/307, 309, 324/313, 314, 318, 300; 600/410

(56) References Cited

U.S. PATENT DOCUMENTS 5,999,839 A * 12/1999 Hardy et al. ................ 600/413
6,404,198 B1 * 6/2002 Duerk et al. ................ 324/314
2002/0153892 A1 * 10/2002 Roell .......................... 324/309

FOREIGN PATENT DOCUMENTS

DE          199 06 859         10/1999

* cited by examiner

Primary Examiner—Brij B. Shrivastav
(74) Attorney, Agent, or Firm—Schiff Hardin LLP

(57) ABSTRACT

In a hybrid CSI procedure for a magnetic resonance device, for a predeterminable volume of interest of the hybrid CSI procedure, the magnetic resonance device automatically defines an increased volume that exceeds the volume of interest such that all magnetic resonance signal-emitting substances of interest contained in the volume of interest are excited in order to create the magnetic resonance signals to be evaluated spectroscopically, and a saturation volume directly adjoining the volume of interest is automatically defined and saturated before the excitation by the magnetic resonance device such that no unwanted magnetic resonance signals are created from outside the volume of interest.

11 Claims, 4 Drawing Sheets

HYBRID CSI PROCEDURE

BACKGROUND OF THE INVENTION

1. Field of the Invention

The present invention concerns a hybrid CSI procedure for a magnetic resonance apparatus.

2. Description of the Prior Art

Magnetic resonance spectroscopy has been used for more than four decades in basic physical, chemical, and biochemical research, e.g. as an analysis technique or for determining the structure determination of complex molecules. Magnetic resonance spectroscopy, like magnetic resonance tomography, is based on the principle of nuclear magnetic resonance, but the objective of spectroscopy is not imaging, but the analysis of a substance. Resonance frequencies of isotopes that have a magnetic moment, e.g. $^1H$, $^{13}C$ or $^{31}P$, are dependent on the chemical structure of molecules, in which the aforementioned isotopes are bonded. A determination of the resonance frequencies therefore allows a differentiation between different substances. The signal intensity at the different resonant frequencies provides information about the concentration of the molecule in question.

If a molecule is disposed in the main magnetic field of a magnetic resonance device, as occurs in spectroscopy, electrons of the molecule protect the atomic nuclei of the molecule from the main magnetic field. Due to this effect, the local magnetic field at the location of an atomic nucleus is modified by a factor of several millionths of the outer main magnetic field. The associated variation of the resonant frequency of this atomic nucleus is called chemical shift. Molecules are identified based on their chemical shift. Since frequency differences are easier to measure and more exactly ascertainable than absolute frequencies, the chemical shift relative to a reference signal, for example relative to the operating frequency of the magnetic resonance device, is given in ppm (parts per million).

A resonance line of an atomic nucleus can be split into several lines, if other atomic nuclei with a magnetic moment are located in the vicinity of the atomic nucleus under consideration. The cause lies in the so-called spin-spin coupling between the atomic nuclei. The magnetic flux density of the main magnetic field that acts upon an atomic nucleus thus depends not only on the electron shell around this atomic nucleus, but also on the orientation of the magnetic field of the neighboring atoms.

Clinical magnetic resonance spectroscopy is understood to be magnetic resonance spectroscopy using clinical magnetic resonance devices. The procedures of localized magnetic resonance spectroscopy differ from those of magnetic resonance imaging mainly in that, with spectroscopy, the chemical shift is resolved in addition to local tomographic resolution. Two localization procedures currently dominate clinical use. One procedure involves single volume techniques based on echo procedures, in which a spectrum of a previously selected target volume is recorded. The others are spectroscopic imaging procedures, so-called CSI procedures (Chemical Shift Imaging), which enable the simultaneous recording of spectra primarily of target volumes that are spatially connected.

Spectroscopic imaging procedures are used in clinical phosphorous as well as proton spectroscopy. A three-dimensional CSI procedure includes, for example, after a non-slice selective 90° RF pulse activating, a combination of magnetic phase coding gradients of the three spatial directions for a set period of time followed by readout of the magnetic resonance signal in the absence of all gradients. This is repeated with other combinations of phase coding gradients until the desired local resolution is reached. A four-dimensional Fourier transformation of the magnetic resonance signal delivers the desired spatial distribution of the resonance lines. A two-dimensional CSI procedure is created from the previously described three-dimensional one by replacing the aforementioned, non-slice-selective RF pulse is with a slice-selective stimulus, formed by a slice-selective RF pulse and the corresponding magnetic gradient, and a gradient in the phase-coding direction is omitted.

The normally used single volume techniques are based on detecting a stimulated echo or a secondary spin echo. In both cases, a local resolution occurs by consecutive selective stimuli of three orthogonal slices. A target volume thus is defined by an intersection volume of the aforementioned three slices. Only a magnetization of the target volume responds to all three selective RF pulses and thus contributes to the stimulated echo or secondary spin echo. The spectrum of the target volume is determined by one-dimensional Fourier transformation of the time signal corresponding to the stimulated echo or the secondary spin echo.

A hybrid CSI procedure is achieved by the integration of phase coding tables into a single volume technique. Compared to the single volume technique, the hybrid CSI procedure within a volume of interest (VOI) enables the selection of voxels. Since in slice selection the exact slice position depends on the resonant frequency of the stimulated spin ensemble, the area in which, e.g., fat is stimulated is shifted to the area in which water is stimulated. This phenomenon is called the chemical shift artifact. Some of the hybrid CSI procedures offer an adjustable parameter called frequency shift, with which it is possible to determine to which frequency the slice positioning should relate. For the selected frequency, the slice positioning is exact. With an increasing frequency spread, the shift increases linearly. Thus, with hybrid CSI procedures, it should be expected that magnetic resonance signals, which lie outside the selected frequency, can be absorbed in voxels in the border area of the volume of interest.

German OS 199 06 859 describes the combination of a volume stimulus, as with the single volume technique based on a secondary spin echo, with very selective saturation pulses outside of the volume for suppressing a signal from outside of the volume in question and for minimizing the chemical shift error in this volume.

Furthermore, the intensive water signals often are suppressed with clinical proton spectroscopy. A procedure for so-called water suppression is, for example, the CHESS technique, in which the nuclear spins of the water molecules are selectively stimulated first by narrowband 90° RF pulses and their cross-magnetization is then de-phased by the switching of magnetic field gradients. Thus, ideally, there is no further detectable magnetization of the water molecules in an immediately subsequent spectroscopy procedure

SUMMARY OF THE INVENTION

An object of the present invention is to provide an improved hybrid CSI procedure, in which magnetic resonance signals, in particular originating from the border areas of a volume of interest, of all magnetic resonance signal-producing substances of interest are free of damping.

This object is achieved in accordance with the invention by a hybrid CSI procedure for a magnetic resonance apparatus wherein, for a predeterminable volume of interest of the hybrid CSI procedure, the magnetic resonance apparatus automatically defines an increased volume that exceeds the volume of interest such that all magnetic resonance signal-emitting substances of interest contained in the volume of interest are excited in order to create the magnetic resonance signals to be evaluated spectroscopically, and wherein a saturation volume directly adjoining to the volume of interest is automatically defined and is saturated before the excitation by the magnetic resonance device such that no unwanted magnetic resonance signals are created from outside the volume of interest.

The aforementioned definitions and the underlying calculations can be made in the control computer and/or sequence controller of the magnetic resonance apparatus.

Due to the fact that the magnetic resonance device automatically calculates the increased volume, as well as due to preliminary saturation measures for the stimulation based on the pre-determined volume of interest, the effect of the chemical shift artifact with respect to the volume of interest is eliminated. This is particularly advantageous for high main magnetic field strengths of three tesla or more, since the effects of the chemical shift artifact generally increase with the main magnetic field strength.

DESCRIPTION OF THE PREFERRED EMBODIMENTS

Figure 1:
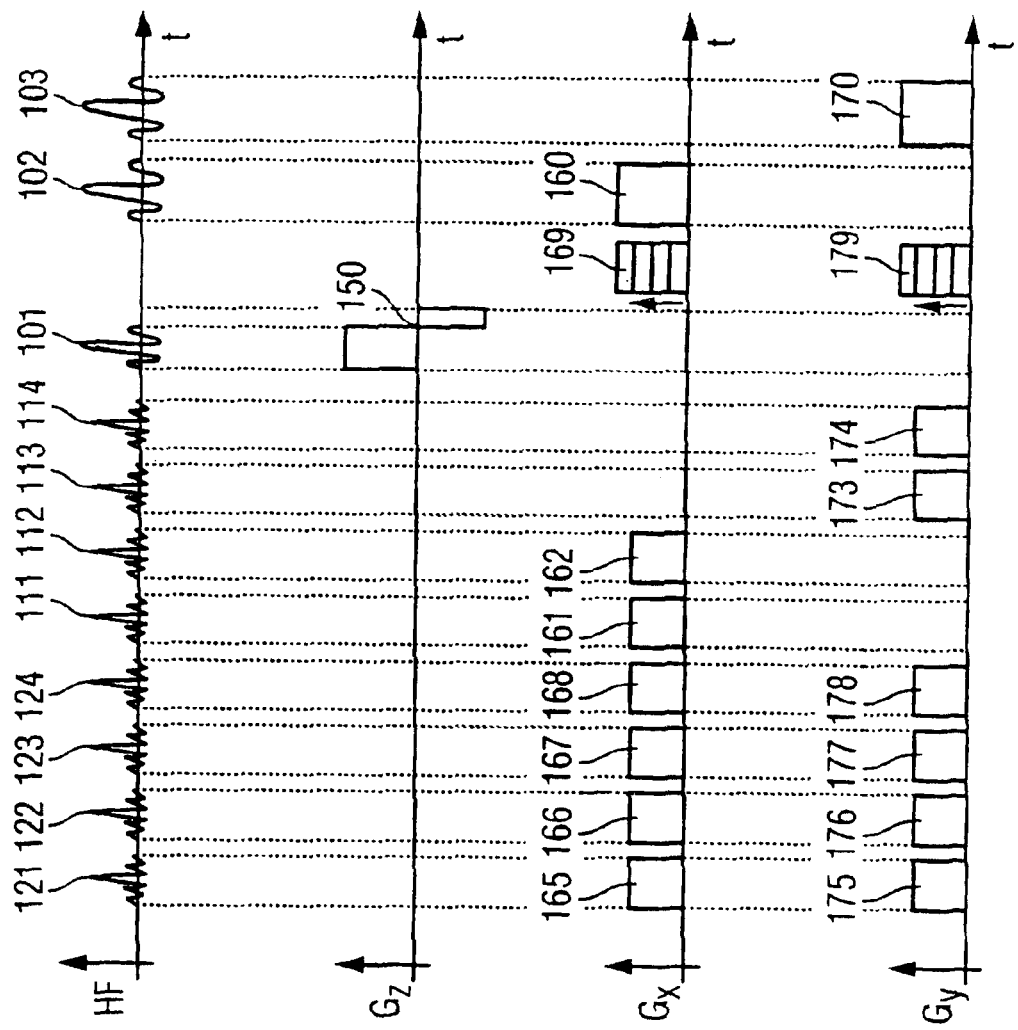
FIG. 1 shows an RF-pulse and gradient sequence of a hybrid CSI procedure suitable for use in accordance with the invention.

The embodiment of the invention in FIG. 1 shows an RF-pulse and gradient schema with idealized square-like gradient pulses 150 through 179 of a hybrid CSI procedure based on a secondary spin echo. In a time sequence, a slice-selective RF stimulus pulse 101 is emitted in a first direction in connection with a gradient pulse 150 of a gradient $G_z$, a first selective RF refocusing pulse 102 is emitted in a second direction in connection with a gradient pulse 160 of a gradient $G_x$, and a second selective RF refocusing pulse 103 is switched in a third direction in connection with a gradient pulse 170 of a gradient $G_y$. The RF stimulus pulse 101 is emitted such that it causes a flip angle of 90°. The selective RF refocusing pulses 102 and 103 each cause a flip angle of 180°. A local resolution within the section volume is achieved by a stepping of the phase coding gradient pulses 169 and 179 for each repetition of the illustrated sequence.

Figure 2:
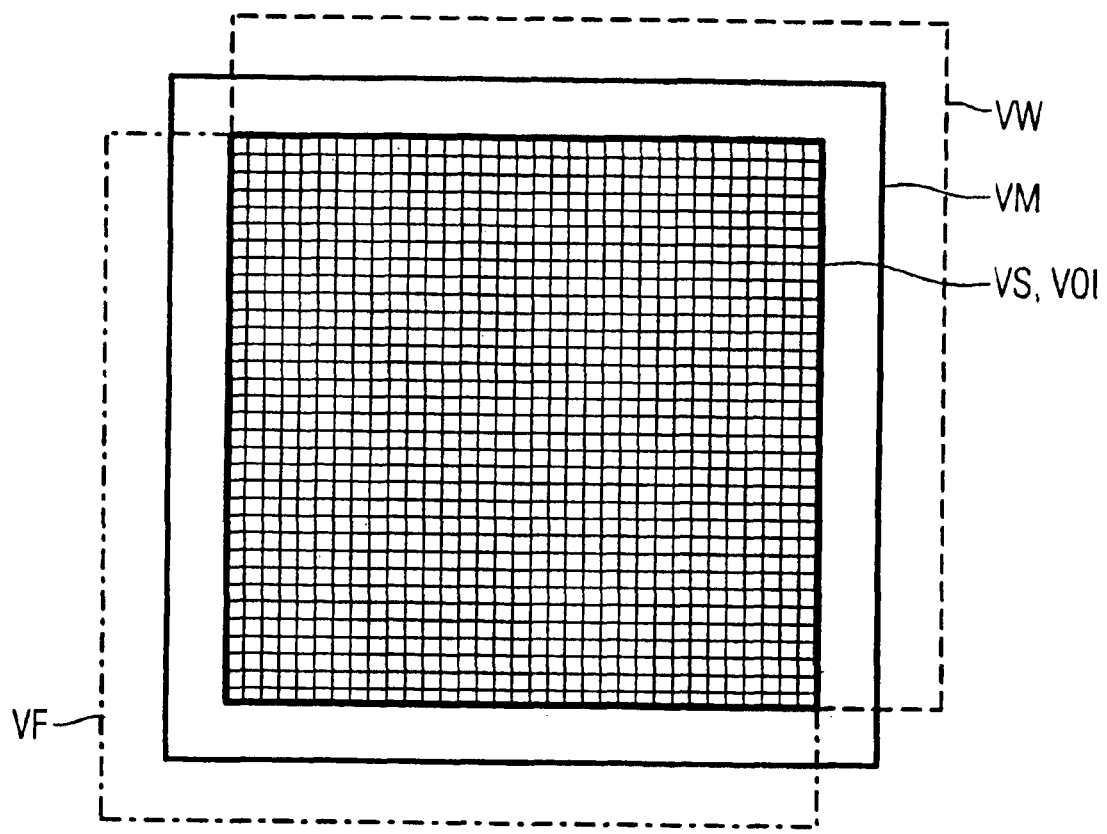
FIG. 2 shows the shift of the slice volumes of fat and water towards each other.

The main purpose of the procedure based on the invention is the automatic elimination of the chemical shift artifact with respect to a volume of interest in a hybrid CSI procedure. FIG. 2 illustrates this problem, that occurs with hybrid CSI procedures, which is that the graphical view positioning is only exact for the first substance with a certain resonance frequency, and a shift should be taken into consideration in the graphical representation for other substances that have other resonance frequencies. In FIG. 2, the slice volume VM represented by the solid line, e.g. for a substance with a resonant frequency between fat and water, is exact, so that, for fat, the shifted slice volume VF represented by the dotted and dashed line and, for water, the slice volume VW represented by the dashed line are to be taken into consideration. Thus, in clinical practice, fat and water are generally those substances of interest with the smallest or largest resonant frequency. For an evaluation, however, only the crosshatched section volume VS of all substances of interest that experience excitation is of interest as a section between the view volumes VF and VW of fat and water. According to the invention, this section volume VS is now represented graphically as the volume of interest VOI and the magnetic resonance device automatically calculates a volume beyond this for the excitation in connection with saturation measures so that all substances of interest contained in the volume of interest VOI deliver signal contributions and, at the same time, no signal contributions occur from outside the volume of interest VOI.

Figure 3:
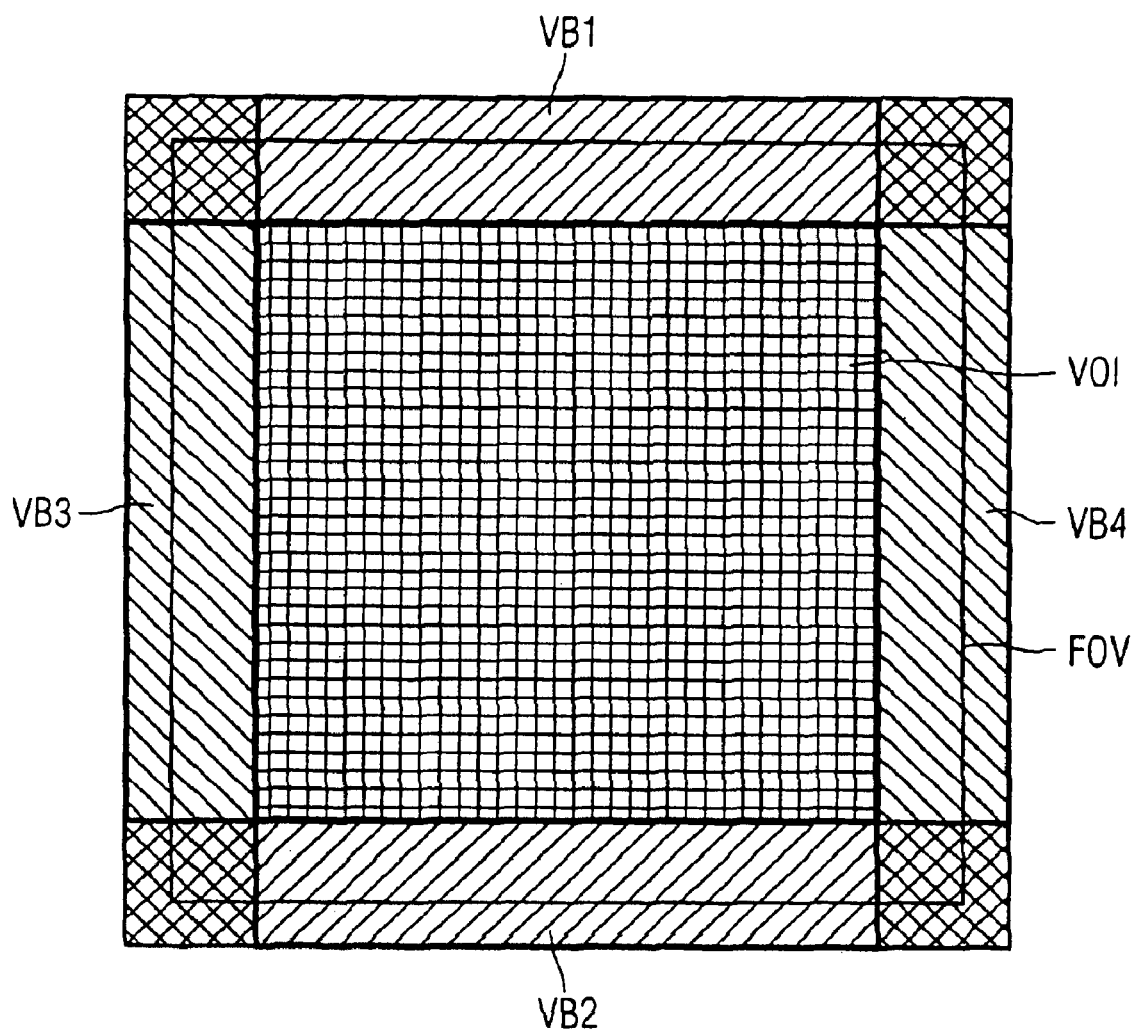
FIG. 3 shows a volume of interest in connection with a saturation volume in accordance with the invention.

In accordance with the above description, FIG. 3 shows the volume of interest VOI of the hybrid CSI procedure set by a user on a graphical user interface as the aforementioned section volume VS. The selection of the volume of interest VOI is performed, for example, based on an anatomical magnetic resonance overview image. The magnetic resonance device thereupon automatically includes a saturation volume, extending around the volume of interest VOI in a two-dimensional manner, which prevents aliasing from the excited volume outside the volume of interest VOI into the volume of interest VOI during magnetic resonance excitation following saturation. The thickness of the saturation volume corresponds to the resonant frequency difference between water and fat, and the saturation occurs in particular in those directions in which the volume of interest VOI has a comparably large spatial expansion. Thus, in the 2D hybrid CSI procedure described as an example, the saturation takes place in both directions, orthogonal to the slice selection direction. In a 3D hybrid CSI procedure, as a rule, this should have taken place in all three directions, i.e. also in the slice selection direction of the 2D procedure. The saturation selection volume around the volume of interest VOI thus is divided into four bar-shaped volumes VB1 through VB4. Referring back to FIG. 2, a saturation of the four bar-shaped volumes VB1 through VB4 described above is achieved by RF saturation pulses 111 through 114 and the related gradient pulses 161, 162, 173, and 174, which are automatically set for the magnetic resonance device based on the aforementioned considerations without a further input by the user.

Moreover, if it is assumed (without limiting the overall utility of the procedure) that the excitation takes place based on a resonance frequency between that of water and fat, then an increased volume FOV (Field of View), which emanates from the volume of interest VOI, is to be taken into consideration for the recording of the magnetic resonance signal to be evaluated spectroscopically, so that the volume of interest VOI in both directions orthogonal to the slice selection direction is expanded by a thickness corresponding to half of the resonant frequency difference between water and fat plus a security supplement in the amount of a few percent of the resonance frequency difference. With the increased volume FOV, it is ensured that all metabolites contained in the volume of interest VOI are excited in order create the magnetic resonance signals to be evaluated spectroscopically. The above-described RF pulses 101 through 103 and gradient pulses 150, 160, 169, and 179 then refer to the aforementioned increased volume FOV.

Figure 4:
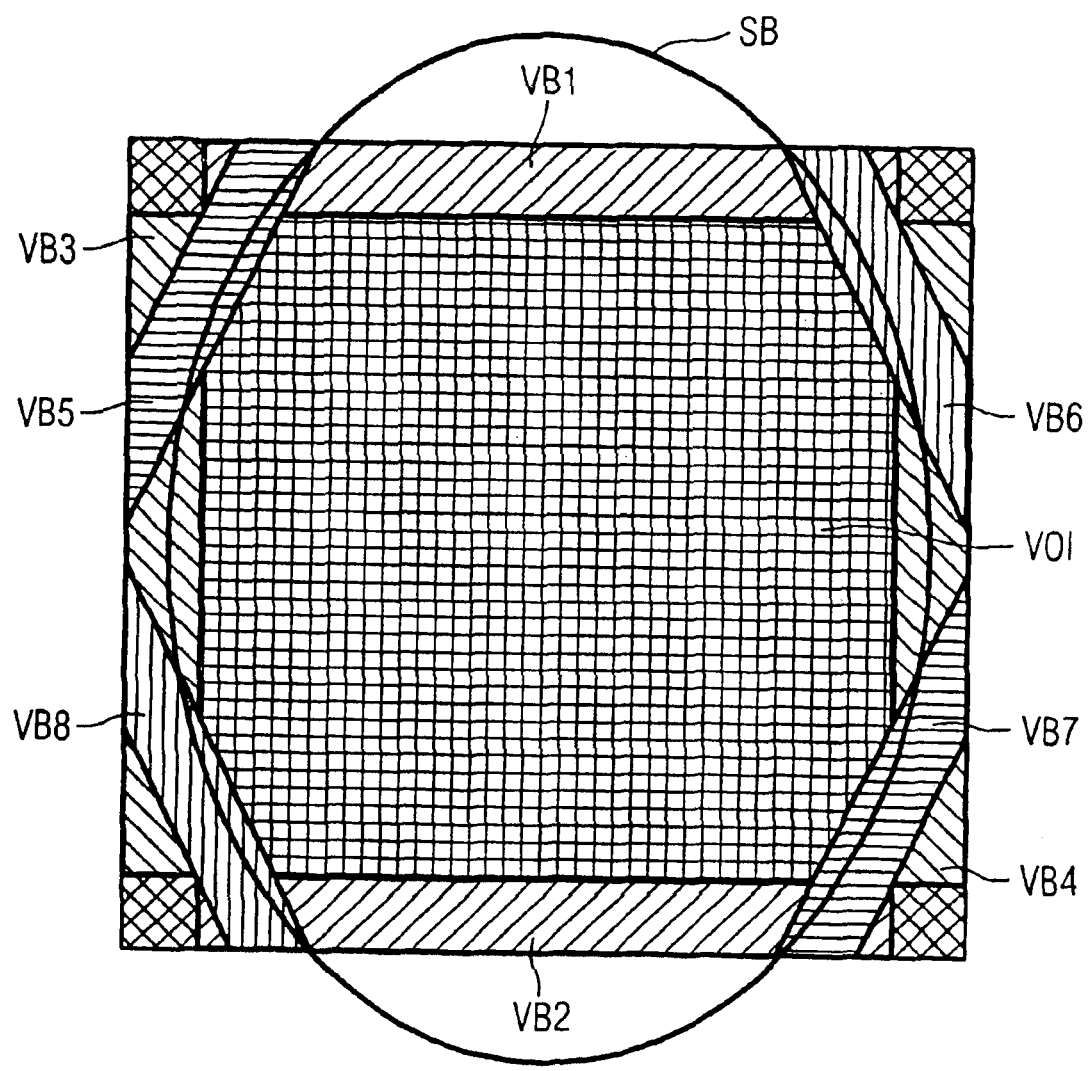
FIG. 4 shows the volume of interest in connection with an anatomical cross section and additional freely pre-determinable saturation volumes.

As an expansion on the aforementioned description, FIG. 4 shows a graphical positioning of the volume of interest on an axial cross section SB of a human brain, such that the corner areas of the volume of interest VOI extend over the cross section SB of the brain. In order to keep unwanted signal contributions out of these corner areas, additional saturation volumes, e.g. the four bar-like volumes VB5 through VB8 represented in FIG. 4, can be defined by the user, whereby their saturation is accomplished through the RF saturation pulses 121 through 124 and the gradient pulses 165 through 168 and 175 through 178 in FIG. 1.

For clarity, FIG. 1 does not show the strong spoiler gradient pulses, which (as is known) are activated in all three directions immediately prior to and following each of the RF pulses 101 through 124.

The presentation in FIG. 4 can be expanded in an embodiment for suppressing magnetic resonance signals of a certain frequency or a certain frequency range, by emitting chronologically preliminary RF and gradient pulses preceding the depicted sequence. For suppressing, for example, the intensive water signals, water molecules are selectively excited with a narrowband 90° RF stimulus pulse and its cross-magnetization is then de-phased by spoiler gradient pulses. In a further embodiment, additional pulses for the spectral saturation of fat and water can be introduced in addition to the spectral saturation of the water signal, as is known for example in prostate spectroscopy.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus comprising the steps of:

initially setting a computer of a magnetic resonance apparatus for operating said magnetic resonance apparatus in a hybrid CSI sequence wherein predetermined magnetic resonance signal-emitting substances in a volume of interest will be excited to produce magnetic resonance signals for spectroscopic evaluation;

after initially setting said hybrid CSI sequence, automatically defining, in said computer, an increased volume that exceeds said volume of interest; and automatically in said computer, modifying the initially set hybrid CSI sequence for causing a saturation volume, directly adjoining said volume of interest, to be saturated before said predetermined magnetic resonance signal-emitting substances are excited in said hybrid CSI sequence for preventing unwanted magnetic resonance signals from said increased volume from interfering with the magnetic resonance signals emitted by said predetermined magnetic resonance signal-emitting substances in said region of interest.

2. A method as claimed in claim 1 wherein said volume of interest has a side with a largest spatial extent, and comprising defining said saturation volume to be a volume directly adjoining said side of said volume of interest having said largest spatial extent.

3. A method as claimed in claim 1 comprising selectively setting said volume of interest via a user interface connected to said computer, in said initial setting of said hybrid CSI sequence.

4. A method as claimed in claim 1 comprising initially setting said hybrid CSI sequence to excite, as said predetermined magnetic resonance signal-emitting substances, a first substance at a first magnetic resonant frequency and a second substance at a second magnetic resonant frequency that is higher than said first magnetic resonant frequency.

5. A method as claimed in claim 4 comprising initially setting said hybrid CSI sequence to excite fat as said first substance and to excite water as said second substance.

6. A method as claimed in claim 4 comprising automatically defining said saturation volume with a thickness, directly adjoining said volume of interest, at least equal to a frequency difference between said second and first magnetic resonant frequencies.

7. A method as claimed in claim 4 comprising setting said hybrid CSI sequence for exciting said first and second substances at a mean magnetic resonant frequency between said first and second magnetic resonant frequencies for expanding said volume of interest on both sides of a spatial direction by a thickness corresponding to one-half of a frequency difference between said second and first magnetic resonant frequencies.

8. A method as claimed in claim 7 comprising automatically additionally increasing said thickness by a safety margin.

9. A method as claimed in claim 8 comprising increasing said thickness by said safety margin as a percentage of said frequency difference.

10. A method as claimed in claim 1 comprising allowing an additional saturation volume to be freely entered into said computer by a user via a user interface connected to said computer.

11. A method as claimed in claim 1 comprising operating said magnetic resonance apparatus with said computer to saturate said saturation volume using selective saturation pulses.

* * * * *